March 17, 1959 — R. C. CARLSON — 2,878,378

CHASSIS ASSEMBLY FOR TV TUNER

Filed Aug. 14, 1956 — 2 Sheets-Sheet 1

INVENTOR.
Reuben C. Carlson
BY
J. D. Douglass
HIS ATTORNEY

March 17, 1959 R. C. CARLSON 2,878,378

CHASSIS ASSEMBLY FOR TV TUNER

Filed Aug. 14, 1956 2 Sheets-Sheet 2

INVENTOR.
Reuben C. Carlson
BY
J. D. Douglas
HIS ATTORNEY 2,878,378

CHASSIS ASSEMBLY FOR TV TUNER

Reuben C. Carlson, River Grove, Ill., assignor to Admiral Corporation, Chicago, Ill., a corporation of Delaware Application August 14, 1956, Serial No. 603,997

7 Claims. (Cl. 250—20)

This invention relates to a tuner assembly for a television receiver.

In order to manufacture television receivers at low cost it is necessary that the various parts which make up the receiver be designed for ready and accurate assembly not requiring exceptional skill or attention on the part of the manufacturing personnel. Prior tuners for television receivers have not been entirely satisfactory from the standpoint of manufacturing cost, one of the important reasons for this being the difficulty involved in making the proper soldered connections for the various components in the tuner.

The present invention is directed to a novel television tuner assembly which substantially avoids the disadvantages associated with the assembly of prior tuners.

It is an object of the present invention to provide a novel and improved televesion tuner assembly.

It is also an object of this invention to provide a novel television tuner assembly which facilitates the low-cost and accurate manufacture of the tuner.

Another object of this invention is to provide a novel television tuner assembly which facilitates the placing of the electrical components on the chassis and also facilitates making the soldered connections of those components in the tuner circuit.

Further objects and advantages of the present invention will be apparent from the following description of a particular preferred embodiment thereof, which is illustrated in the accompanying drawings.

Figure 1:
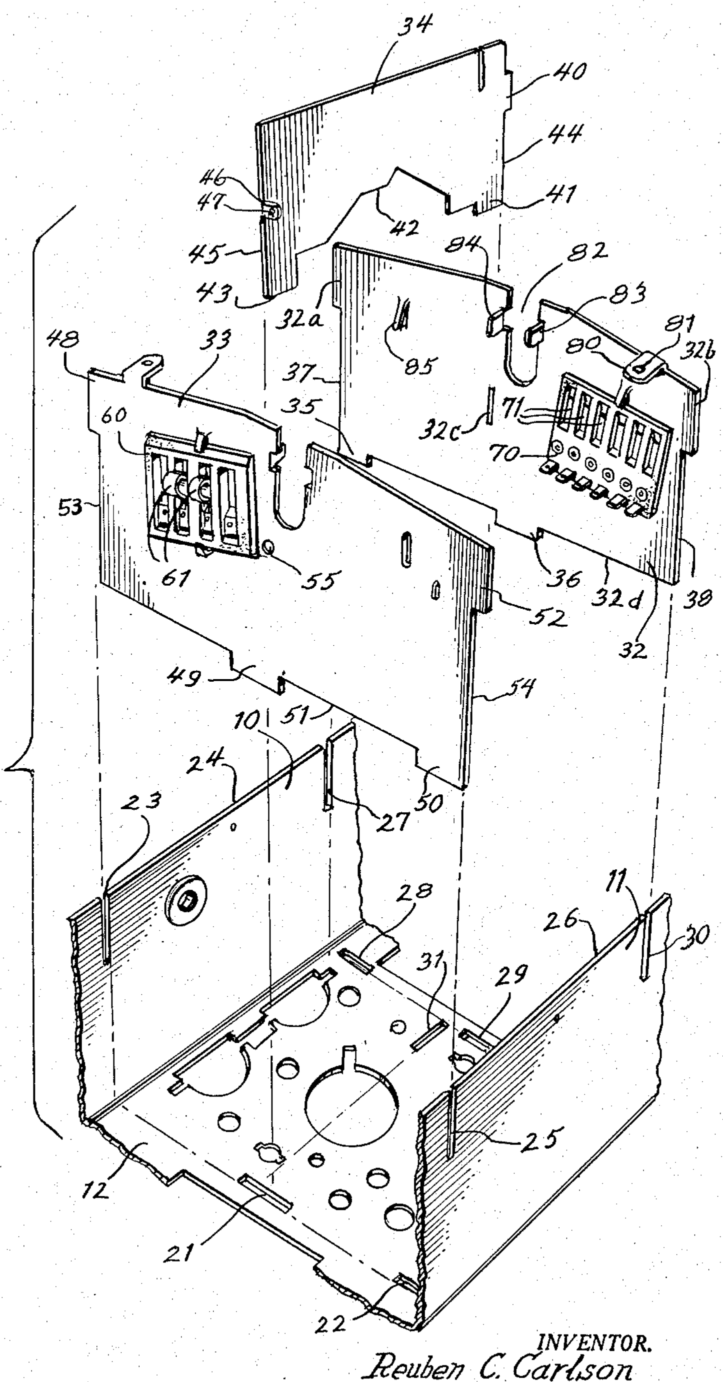
Figure 1 is an exploded perspective view of the chassis assembly in the present tuner.

Referring to Fig. 1, in the present tuner there is provided a metal chassis including a major portion which has spaced, parallel end walls 10 and 11 interconnected by a flat transverse wall 12, which extends perpendicular to the end walls. Preferably, this major portion 10–12 of the chassis is in the form of an integral sheet metal stamping.

The end wall 10 supports an insulation plate 13 (Figs. 2 and 3) in spaced relation to its inner face. This insulation plate carries the components which make up the antenna transformer, indicated generally at 14. The lead-in wires 15, 16 from the antenna extend through apertures 17, 18 in the insulation plate 13 and are suitably connected to the antenna transformer components.

The fixed components of a radio frequency amplifier are supported on the transverse wall 12 adjacent the end wall 10. The socket 19 for the radio frequency amplifier tube (Fig. 3) is mounted to extend through the transverse chassis wall 12 toward the middle of that wall, but slightly closer to the end wall 10 than to the end wall 11.

By an arrangement which preferably is as shown in my copending U. S. patent application Serial No. 528,262, filed August 15, 1955, the tuner is provided with a plurality of inductances and a switching arrangement for selectively connecting these inductances in circuit with the fixed components of the radio frequency amplifier. In this manner, the frequency band covered by any selected television channel may be chosen and the incoming signal in that band amplified in the radio frequency amplifier.

Adjacent the other end wall 11 the transverse chassis wall 12 supports the fixed components of the oscillator and mixer in the tuner. Associated with the fixed components of the oscillator are a plurality of inductances, which are selectively switched into the oscillator circuit to control the frequency of the oscillator. Desirably, the arrangement shown in my above-mentioned application Serial No. 528,262 may be provided for this purpose. In the mixer the output signal from the oscillator is heterodyned against the output signal from the radio frequency amplifier, and the difference signal is fed into the I. F. stage of the receiver, as is well understood by those skilled in this art. A double triode mounted in a socket 20 (Fig. 3) serves as both the oscillator tube and the mixer tube in the present tuner.

At each side of the components supported by its transverse wall 12 the integral major portion of the chassis is formed with a plurality of aligned slots. Thus, at the left side in Fig. 1, the transverse wall 12 is formed with a pair of spaced rectangular slots 21 and 22, the end wall 10 is formed with a similar slot 23 which is open at the edge 24 of this end wall remote from the transverse wall 12, and the other end wall 11 has a similar slot 25 which is open at the edge 26 of this end wall remote from the transverse wall 12. All of these slots are aligned. At the right side of the components in Fig. 1, the end wall 10 has an elongated slot 27 open at the outer edge 24 of this end wall, the transverse wall 12 has spaced elongated slots 28, 29, and the end wal 11 has an elongated slot 30 which is open at the outer edge 26 of this end wall. All of these slots at the right side of the components on the chassis in Fig. 1 are aligned.

In addition, the transverse wall 12 has another slot 31 which is elongated perpendicular to the direction of elongation of slots 28 and 29. Slot 31 is aligned with the middle of the socket 19 for the radio frequency amplifier tube.

In accordance with the present invention the chassis is provided with a pair of opposite side walls 32, 33 and a dividing wall 34, which are to be mounted on the chassis to provide separate shielded compartments for the R. F. amplifier components and for the oscillator and mixer components, respectively.

The right side wall 32 at one end has a protrusion **32*a* for reception in the slot 27 in end wall 10. At its other end side wall 32 has a similar protrusion 32*b* positioned to be received snugly in the slot 30 in end wall 11. At its inner edge the side wall 32 has spaced protrusions 35, 36 which are located to be received in the slots 28 and 29, respectively, in the transverse wall 12. The length of the side wall 32 between its end edges 37 and 38 is just slightly less than the spacing between the end walls 11 and 12**.

The side wall 32 is assembled onto the major portion of the chassis by inserting it between the end walls 10, 11 and toward the transverse wall 12 until its protrusions 35, 36 are received in the slots 28, 29 and its protrusions **32*a*, 32*b* are received in the slots 27 and 30, respectively. In this assembled position the side wall 32 has its inner edge 32*d* abutting against the inner face of the transverse wall 12**.

The dividing wall 34 is formed with a protrusion 40 at one side edge which is positioned to be received in a substantially longer vertical slot 32*c* formed in side wall 32. At its inner edge the dividing wall 34 has another protrusion 41 located to be received snugly in the aperture 31 in the transverse wall 12. Also, at its inner edge the dividing wall 34 is cut away at 42 so as to straddle the R. F. amplifier tube socket 19, which protrudes beyond the inner face of the transverse wall 12. On the other side of this cut away portion the dividing wall 34 presents a flat inner edge 43 for engagement with the inner face of the transverse wall 12 at the left side of the R. F. amplifier socket 19 in Fig. 1. The length of the dividing wall 34 between its opposite side edges 44 and 45 is substantially equal to the spacing across the transverse wall between the aligned slots 28, 29 at one side and the aligned slots 21, 22 at the other. At its right side edge 45 in Fig. 1 the dividing wall is formed with a transverse ear 46 having an opening 47 for receiving a screw.

After the side wall 32 has been assembled on the chassis, as described, the dividing wall 34 is inserted toward the transverse wall 12. When the protrusion 40 on one side edge of the dividing wall 34 is received in the slot 32*c* in side wall 32 and the protrusion 41 on the inner edge of the dividing wall 34 is received in the slot 31 in transverse wall 12, this locates the dividing wall 34 so that it extends substantially perpendicular to both the transverse wall 12 and the side wall 32. When inserting the dividing wall 34 in place, its protrusion 40 is first inserted into the upper end of slot 32*c* in the side wall 32 and then the dividing wall 34 is dropped down to position its protrusion 41 in the slot 31 in the transverse wall 12 of the main chassis portion. In this position, the inner edge 43 of the dividing wall 34 rests on the inner face of the transverse wall 12 at the left side of the R. F. amplifier tube socket 19 in Fig. 1. At the socket 19 for the R. F. amplifier tube the input terminals are positioned to the left of the dividing wall 34 in Fig. 1 and the output terminals to the right when the dividing wall is inserted in place, as described.

The left side wall 33 at one end has a protrusion 48 positioned to be received in the slot 23 in end wall 10, a pair of spaced protrusions 49, 50 at its inner edge 51 for reception in the slots 21, 22, respectively, in transverse wall 12, and a protrusion 52 at its opposite end located to be received in slot 25 in end wall 11. The length of side wall 33 between its end edges 53 and 54 is slightly less than the spacing between the chassis end walls 10 and 11. Side wall 33 has a hole 55 positioned to register with the hole 47 in the transverse ear 46 on the dividing wall 34 when the parts are in their assembled position.

Following the assembly of side wall 32 and dividing wall 34 on the chassis, as described, the side wall 33 is assembled in place by inserting it between the end walls 10 and 11 and toward the transverse wall 12. The end protrusions 48 and 52 on the side wall 33 enter the open-ended slots 23 and 25, respectively, on the end walls 10 and 11. Then the inner protrusions 49 and 50 on side wall 33 enter the slots 21 and 22, respectively, on the transverse wall 12. The inner edge 51 of side wall 33 abuts against the inner face of transverse wall 12 and this side wall is now properly positioned, extending parallel to the other side wall 32. A screw 56 (Fig. 2) is then threaded into the opening 55 in side wall 32 and the registering opening 47 in lug 46 on the dividing wall 34 to lock the assembled side walls 32, 33 and dividing wall 34 in place on the main portion of the chassis.

The side walls 32, 33 and the dividing wall 34 then may be finally secured in place by soldering at each location where a protrusion is received in a slot in the chassis assembly, as well as at other locations, as desired.

The side wall 33 supports an insulation block 60 which carries switch contacts 61 exposed at the outer side of wall 33 (Fig. 3) and suitably connected to the fixed components in the R. F. amplifier circuit. These contacts are positioned to be engaged selectively by contacts 62 carried by an insulation disc 63 mounted on the rotatable tuning shaft 64, as described in greater detail in my copending application Serial No. 528,262, mentioned above. The disc contacts 63 are connected to inductances 65 on the opposite face of the disc which are selectively switched into the R. F. amplifier circuit of the receiver, depending upon the position to which shaft 64 is turned. The contact supporting block 60 on the side wall 33 is located at one side of the dividing wall 34, closely adjacent the R. F. amplifier components on the transverse chassis wall 12, so that the lead wires connecting these components to the corresponding switch contacts are extremely short, which is desirable.

At the opposite side of the dividing wall 34 the other side wall 32 carries an insulation block 70 provided with a plurality of switch contacts 71 exposed at the outer face of side wall 32. The fixed oscillator components supported by transverse chassis wall 12 have suitable connections to these contacts. These contacts are positioned to be engaged selectively by contacts 72 on an insulation disc 73 carried by shaft 64. Disc 73 also carries inductances 74 connected to the contacts 72 so as to be selectively switched into circuit with the fixed oscillator components, depending upon the angular position of shaft 64. With the contacts on block 70 located at the same side of the dividing wall 34 as the oscillator components on transverse wall 12 and closely adjacent those components, the lead wires connecting the oscillator components to the switch contacts 71 are quite short.

As best seen in Fig. 1, side wall 32 at its outer edge is formed with a bent over transverse ear 80 having an opening 81. At the middle of its outer edge side wall 32 is formed with an oblong opening 82 which is semi-circular at its inner end to provide a bearing support for the shaft 64. A pair of transverse lugs 83, 84 are formed at either side of this opening above its semi-circular inner end. At the other side of the central opening 82 the side wall 32 is formed with an inwardly struck out ear 85.

Figures 2, 3:
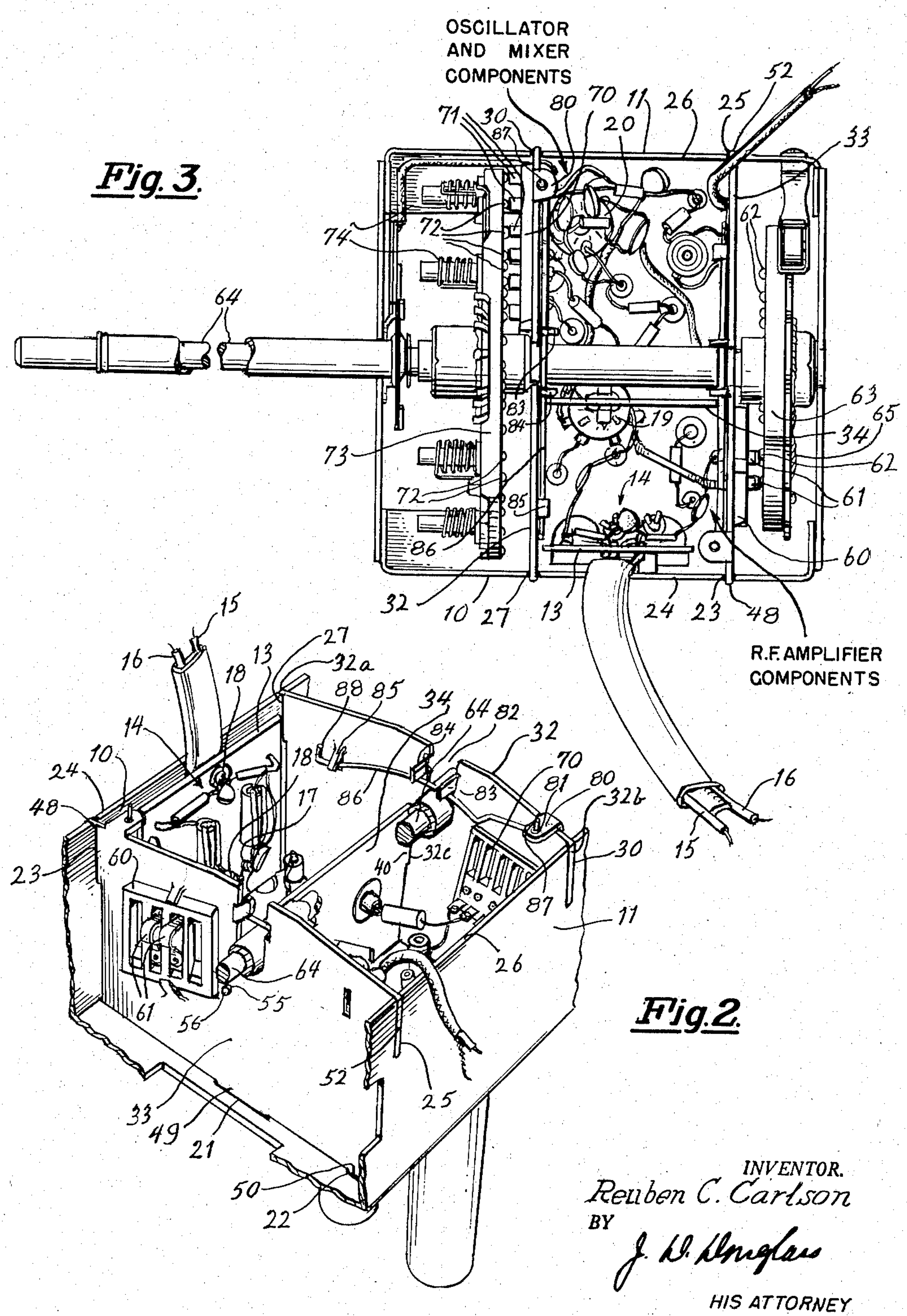
Figure 2 is a fragmentary perspective view of the tuner with the chassis assembled.
Figure 3 is a plan view of the assembled tuner, viewed from the underside of the tuning shaft.

Referring to Fig. 2, there is provided a spring for holding shaft 64 in place. This spring includes a transverse extremity 87 received in the opening 81 in the transverse ear 80 on side wall 32, a middle portion 86 which extends across shaft 64 to retain the shaft seated in the semi-circular inner end of opening 82, and an opposite transverse extremity 88 located at the opposite side of the struck out ear 85. This spring is assembled in place by first inserting its transverse extremity 87 up through the hole 81 in ear 80 on side wall 32, then positioning its middle portion 86 between shaft 64 and the lugs 83, 84 on the side wall, and then positioning its other end snugly under the struck out ear 85.

An identical arrangement is provided at the other side wall 33 for retaining the shaft in place there.

At one of the side walls the shaft is cut away to provide a groove of substantially the same width as the thickness of the side wall, so that the shaft is retained snugly against displacement axially.

With the foregoing arrangement, before the side walls 32, 33 and the dividing wall 34 are assembled on the chassis the R. F. amplifier, oscillator and mixer components are first assembled onto the transverse wall 12 of the integral main chassis portion. Due to the open configuration of the main chassis portion, the transverse wall 12 is readily accessible at both of its faces so that all of these connections are made out in the open, which greatly facilitates the assembler's job.

Similarly, the end wall 10 of the main chassis portion is readily accessible at both sides for purposes of securing the antenna transformer 14 in place and making its connections to the antenna lead-in line and to the R. F. amplifier.

Then, after the chassis side walls 32, 33 and dividing wall 34 have been assembled in place, the various soldered connections of the R. F. amplifier and oscillator components to the switch contacts carried by these side walls may be made out in the open, there being nothing to obstruct the insertion of the soldering iron from opposite the transverse wall 12 between the end walls 10, 11 and side walls 32, 33. Obviously, this is of great advantage to the speed and accuracy with which these connections may be made.

After all of the circuit connections on the tuner have been made, the tuning shaft 64 is then inserted in place on the side walls 32, 33 and secured there by the described retaining springs.

Finally, a suitable metal cover (not shown) is placed on the chassis to substantially enclose it at the side walls 32, 33 and opposite the transverse wall 12, so as to substantially shield the tuner from the other stages in the television receiver.

Of particular advantage in the present invention is the fact that the first side wall 32 serves to properly locate the dividing wall 34 on the chassis, the dividing wall then being positioned to be secured to the other side wall 33 by screw 56 so as to lock the assembly of the side walls and the dividing wall in place.

The respective spaced side walls 32, 33 are positively located on the integral main chassis portion by means of the interfitting protrusions and recesses. By thus positively locating the side walls, the openings in these side walls are properly positioned to provide bearing supports for the tuning shaft.

Both of the insulation blocks 60 and 70 support the respective series of fixed contacts so that the contacts in each series are positioned in succession along a line radially outward from the tuning shaft which is inclined at an angle of a few degrees toward the transverse chassis wall 12 which supports the fixed R. F. amplifier and oscillator components. This enables the leads to these components to be shorter. Also, it makes the soldering of these leads to the switch contacts more convenient to perform.

From the foregoing, it will be apparent that the present tuner is so constructed as to enable its rapid assembly with a minimum of difficulty in making the proper electrical connections, and hence the least possible likelihood that the assembled tuner may have an improper or defective connection.

It is to be understood that, while there has been described herein and illustrated in the accompanying drawing a particular preferred construction of the present invention and a particular preferred mode of assembling it, various modifications, omissions and refinements which depart from the illustrated construction of the tuner, or from the described mode of assembly, may be adopted without departing from the spirit and scope of this invention.

I claim:

1. In a television tuner, the combination of an integral metal main chassis portion having spaced parallel end walls and a transverse wall extending between and connected to said end walls, radio frequency amplifier components supported on said transverse wall between said end walls and toward one of said end walls, oscillator and mixer components supported on said transverse wall between said end walls and toward the other of said end walls, said main chassis portion being open opposite said transverse wall between the end walls and at each side of said components on said transverse wall between the end walls, a first metal side wall extending between the end walls at one side of said components and engaging said transverse wall, said first side wall having provision for interlocking with the end walls and said transverse wall when inserted from opposite the transverse wall between the end walls and toward the tranverse wall at said one side of said components theron, a metal dividing wall extending from first side wall across said transverse wall between said radio frequency amplifier components and said oscillator and mixer components thereon, said dividing wall having provision for interlocking with said transverse wall and said first side wall when inserted from opposite the transverse wall toward said first side wall and said transverse wall between said radio frequency amplifier components and said oscillator and mixer components, a first insulation support on said first side wall at one side of said dividing wall, a first set of switch contacts carried by said first insulation support and presenting contact surfaces which project outward beyond the outer side of said first side wall facing away from said second side wall, connections to said first set of switch contacts from the components on the transverse wall at said one side of the dividing wall, a second metal side wall extending between the end walls at the other side of said radio frequency amplifier, oscillator and mixer components and engaging said transverse wall, said second side wall having provision for interlocking with said end walls and said transverse wall when inserted from opposite the transverse wall between the end walls and toward the transverse wall at said other side of the components thereon, means connecting said second side wall to said dividing wall, a second insulation support on said second side wall at the other side of said dividing wall, a second set of switch contacts carried by said second insulation support and having contact surfaces which project outward beyond the outer side of said second side wall facing away from said first side wall, and connections to said second set of switch contacts from the components on the transverse wall at said other side of the dividing wall.

2. In a television tuner, the combination of an integral metal main chassis portion comprising spaced end walls and a transverse wall extending between and connected to said end walls, a first set of tuner components supported on said main chassis portion toward one of said end walls, a second set of tuner components supported on said main chassis portion toward the other of said end walls, a first metal side wall interfitting with said main chassis portion and located thereby to extend between said end walls at one side of said sets of tuner components, a metal dividing wall interfitting with said first side wall and said transverse wall and located thereby to extend between said first and second sets of tuner components to shield them from each other, a second metal side wall interfitting with said main chassis portion and located thereby to extend between said end walls at the other side of said sets of tuner components thereon and extending between said end walls thereat, means connecting said dividing wall to said second side wall, a first set of switch contacts carried by said first side wall at one side of said dividing wall, the contacts of said first set having contact surfaces which project outward beyond said first side wall facing away from said second side wall, connections to said first set of switch contacts from said first set of tuner components, a second set of switch contacts carried by said second side wall at the opposite side of said dividing wall, the contacts of said second set having contact surfaces which project outward beyond said second side wall facing away from said first side wall, connections to said second set of switch contacts from said second set of tuner components, a rotatable tuning shaft extending transversely between said side walls in spaced relation to said transverse wall, a pair of insulation support members carried by said shaft and positioned in confronting relation to the outer faces of said side walls, and contacts carried by said insulation support members which face inwardly toward the adjacent side walls for engagement selectively with the outwardly facing contact surfaces on said contacts of the first and second sets.

3. In a television tuner, the combination of an integral main chassis portion comprising spaced end walls and a transverse wall extending between and connected to said end walls, radio frequency amplifier components supported on said transverse wall toward one of said end walls, oscillator and mixer components supported on said transverse wall toward the other of said end walls, said main chassis portion being open opposite said transverse wall between said end walls and at each side of said sets of components between the end walls, each of said end walls at each side of the components supported on said transverse wall having slots which are open-ended away from the transverse wall, said transverse wall at each side of the components supported thereon being formed with slots, a first side wall extending between said end walls and across said transverse wall at one side of the components supported thereon, said first side wall at its ends having protrusions received in the open-ended slots in the end walls at said one side of the components supported on said transverse wall and at its inner edge having protrusions received in the slots in the transverse wall at said one side of the components thereon when said first side wall is inserted from opposite the transverse wall between the end walls and toward the transverse wall, said first side wall between the end walls being formed with a slot elongated toward the transverse wall and spaced therefrom, said transverse wall being formed with a slot between the radio frequency amplifier components and the oscillator and mixer components which extends aways from said first side wall, a dividing wall extending from said first side wall across the transverse wall between the radio frequency amplifier components and the oscillator and mixer components, said dividing wall having protrusions received respectively in said slot in the first side wall and said last-mentioned slot in the transverse wall when the dividing wall is inserted from opposite the transverse wall toward said first side wall and said transverse wall between said radio frequency amplifier components and said oscillator and mixer components, a second side wall extending between said end walls and across said transverse wall at the other side of the components supported thereon, said second side wall at its ends having protrusions received in the open-ended slots in the end walls at said other side of the components supported on the transverse wall and at its inner edge having protrusions received in the slots in the transverse wall at said other side of the components thereon when said second side wall is inserted from opposite the transverse wall between the end walls and toward the transverse wall, and means connecting said second side wall to said dividing wall.

4. The combination of claim 3, wherein there are provided a first set of switch contacts supported by one of the side walls at the side of the dividing wall where the radio frequency amplifier components are located, said first set of switch contacts being exposed at the outer side of its supporting side wall, connections to said first set of switch contacts from the radio frequency amplifier components, a second set of switch contacts supported by the other side wall of the opposite side of the dividing wall and exposed at the outer side of said other side wall, and connections to said second set of switch contacts from the oscillator components.

5. In a television tuner, the combination of an integral metal main chassis portion comprising spaced end walls and a transverse wall extending between and connected to said end walls, a first set of tuner components supported on said transverse wall between said end walls toward one of said end walls, a second set of tuner components supported on said transverse wall between said end walls toward the other end wall, a first metal side wall connected to said end walls and to said transverse wall through interfitting protusions and recesses at one side of said sets of tuner components and extending between said end walls, a metal dividing wall connected to said first side wall and said transverse wall through interfitting protrusions and recesses and extending from said first side wall across said transverse wall between said first and second sets of tuner components thereon to shield them from each other, a second metal side wall connected to said end walls and said transverse wall through interfitting protrusions and recesses at the other side of said sets of tuner components and extending from one end wall to the other, a connection between said second side wall and said dividing wall, a first set of switch contacts supported on said first side wall at one side of the dividing wall, the contacts of said first set presenting contact surfaces which extend outward beyond the outer side of said first side wall facing away from said second side wall, connections to said first set of switch contacts from said first set of tuner components, a second set of switch contacts supported on said second side wall at the opposite side of the dividing wall, the contacts of said second set presenting contact surfaces which project outward beyond the outer side of said second side wall facing away from said first side wall, and connections to said second set of switch contacts from said second set of tuner components.

6. In a television tuner, the combination of a main chassis portion supporting radio frequency amplifier components and oscillator and mixer components, a first side wall extending across said main chassis portion at one side of the components thereon, a dividing wall extending transversely away from said first side wall across said main chassis portion and separating the radio frequency amplifier components from the oscillator and mixer components, a second side wall extending across said main chassis portion at the opposite side of the components thereon, said main chassis portion having recesses located on opposite sides of the components thereon, said first and second side walls having protusions received in said recesses to locate said side walls with respect to said main chassis portion, said dividing wall having protusions, said main chassis portion and one of said side walls having recesses which receive said last-mentioned protusions to locate said dividing wall with respect to said main chassis portion and said one side wall, a first set of switch contacts supported by said first side wall at the side of said dividing wall where the radio frequency amplifier components are located, the contacts of said first set presenting contact surfaces which project outward beyond said first side wall facing away from said second side wall, connections to said first set of switch contacts from the radio frequency amplifier components, a second set of switch contacts supported by said second side wall at the opposite side of said dividing wall, the contacts of said second set presenting contact surfaces which project outward beyond said second side wall facing away from said first side wall, connections to said second set of switch contacts from the oscillator components, a rotatable tuning shaft extending transversely between said side walls in spaced relation to said main chassis portion, a pair of insulation support members carried by said shaft and positioned in confronting relation to the outer faces of said side walls, and contacts carried by said insulation support members which face inward toward the adjacent side walls for engagement selectively with the outwardly facing contact surfaces on said contacts of the first and second sets.

7. In a television tuner, the combination of a main chassis portion which includes a transverse wall, first and second sets of tuner components on said transverse wall, said main chassis portion being open opposite said transverse wall, a first side wall extending across the transverse wall at one side of said sets of components thereon, said first side wall being shaped to interlock with said main chassis portion when inserted from opposite the transverse wall toward the transverse wall at said one side of said sets of components thereon, a dividing wall extending from said first side wall across said transverse wall between the first and second sets of tuner components thereon and shielding said sets of components from one another, a second side wall extending across the transverse wall at the other side of said sets of components thereon, said second side wall being shaped to interlock with said main chassis portion when inserted from opposite the transverse wall toward the transverse wall at said other side of said sets of components thereon, means interconnecting said second side wall and said dividing wall, a first set of switch contacts supported by said first side wall at one side of said dividing wall, the contacts of said first set presenting contact surfaces which project outward beyond said first side wall facing away from said second side wall, connections to said first set of switch contacts from the set of tuner components at said side of the dividing wall, a second set of switch contacts supported by said second side wall at the other side of said dividing wall, the contacts of said second set presenting contact surfaces which project outward beyond said second side wall facing away from said first side wall, and connections to said second set of switch contacts from the set of tuner components at said other side of the dividing wall.

References Cited in the file of this patent

UNITED STATES PATENTS

| | | |
|---|---|---|
| 2,668,235 | Nordby | Feb. 2, 1954 |
| 2,718,623 | Yoder | Sept. 20, 1955 |
| 2,755,386 | Thias | July 17, 1956 |
| 2,771,548 | Deutsch | Nov. 20, 1956 |